US008800142B2

(12) United States Patent
Nang et al.

(10) Patent No.: US 8,800,142 B2
(45) Date of Patent: Aug. 12, 2014

(54) PACKAGE SUBSTRATE UNIT AND METHOD FOR MANUFACTURING PACKAGE SUBSTRATE UNIT

(75) Inventors: Hnin Nway San Nang, Kawasaki (JP); Kazuya Arai, Kawasaki (JP); Kei Fukui, Kawasaki (JP); Shinpei Ikegami, Kawasaki (JP); Yasuhito Takahashi, Sunnyvale, CA (US); Hideaki Yoshimura, Kawasaki (JP); Hitoshi Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 313 days.

(21) Appl. No.: 12/929,680

(22) Filed: Feb. 8, 2011

(65) Prior Publication Data
US 2012/0067635 A1    Mar. 22, 2012

Related U.S. Application Data

(60) Provisional application No. 61/344,701, filed on Sep. 16, 2010.

(51) Int. Cl.
*H01K 3/10* (2006.01)
*H05K 3/10* (2006.01)

(52) U.S. Cl.
CPC ..................................... *H05K 3/107* (2013.01)
USPC ......................................................... 29/852

(58) Field of Classification Search
CPC ................................ H05K 3/107; H05K 3/108
USPC .............. 174/260, 262–267; 257/780; 29/852
See application file for complete search history.

(56) References Cited

U.S. PATENT DOCUMENTS

| 6,217,987 | B1 | 4/2001 | Ono et al. |
| 6,281,107 | B1 | 8/2001 | Moriyama |
| 6,841,872 | B1 | 1/2005 | Ha et al. |
| 7,164,208 | B2 * | 1/2007 | Kainou et al. ................ 257/780 |
| 2001/0045668 | A1 | 11/2001 | Liou et al. |
| 2002/0011777 | A1 | 1/2002 | Konishi et al. |
| 2004/0197979 | A1 | 10/2004 | Jeong et al. |
| 2005/0167832 | A1 | 8/2005 | Kainou et al. |
| 2008/0185711 | A1 | 8/2008 | Hsu |
| 2008/0296764 | A1 | 12/2008 | Chang et al. |
| 2009/0242258 | A1 | 10/2009 | So et al. |

(Continued)

FOREIGN PATENT DOCUMENTS

| JP | 9-266230 | 10/1997 |
| JP | 10-242323 | 9/1998 |

(Continued)

OTHER PUBLICATIONS

Korean Office Action mailed Mar. 26, 2012 issued in corresponding Korean Patent Application No. 10-2011-0015720.

(Continued)

*Primary Examiner* — Jeremy C Norris
(74) *Attorney, Agent, or Firm* — Staas & Halsey LLP

(57) ABSTRACT

A semiconductor chip mounting layer of a package substrate unit includes an insulation layer, a conductive seed metal layer formed on the top surface of the insulation layer, conductive pads formed on the top surface of the conductive seed metal layer, metal posts formed substantially in the central portion on the top surface of the conductive pads, and a solder resist layer that is formed to surround the conductive pads and the metal posts.

2 Claims, 15 Drawing Sheets

(56) References Cited

U.S. PATENT DOCUMENTS

| | | |
|---|---|---|
| 2010/0132998 A1 | 6/2010 | Lee et al. |
| 2010/0218986 A1 | 9/2010 | Furuta et al. |
| 2011/0299259 A1* | 12/2011 | Hsieh et al. .................. 361/774 |
| 2012/0006592 A1* | 1/2012 | Ouchi et al. .................. 174/267 |

FOREIGN PATENT DOCUMENTS

| | | |
|---|---|---|
| JP | 2008-42118 | 2/2008 |
| JP | 2009-224581 | 10/2009 |
| JP | 2010-206192 | 9/2010 |
| KR | 10-0330277 | 4/2002 |
| KR | 10-2008-0072542 | 8/2008 |
| KR | 10-2010-0060968 | 6/2010 |

OTHER PUBLICATIONS

Korean Office Action mailed Dec. 18, 2012 issued in corresponding Korean Patent Application No. 10-2011-0015720.

Extended European Search Report mailed Mar. 6, 2013 in corresponding European Patent Application No. 11153062.2.

Taiwanese Office Action mailed Aug. 14, 2013 in corresponding Taiwanese Application No. 100106441.

Korean Office Action issued Sep. 4, 2013 in corresponding Korean Application No. 10-2011-0015720.

Japanese Office Action for related Japanese Patent Application No. 2010-232731, mailed Apr. 15, 2014, 3 pages.

* cited by examiner

| N=20 | CONDI-TION 1 | CONDI-TION 2 | CONDI-TION 3 | CONDI-TION 4 | CONDI-TION 5 | CONDI-TION 6 | CONDI-TION 7 | CONDI-TION 8 |
|---|---|---|---|---|---|---|---|---|
| HEIGHT OF METAL POST | <1 | 1.5 | 1.6 | 1.7 | 2.1 | 2.6 | 4.0 | 4.1 |
| TCB 3500 CYC (-55°C TO +125°C) PASS/TOTAL | 5/20 | 20/20 | 20/20 | 20/20 | 20/20 | 20/20 | 20/20 | 20/20 |

PACKAGE SUBSTRATE UNIT AND METHOD FOR MANUFACTURING PACKAGE SUBSTRATE UNIT

CROSS-REFERENCE TO RELATED APPLICATION

This application claims the benefit of U.S. provisional application No. 61/344,701, filed on Sep. 16, 2010, the entire contents of which are incorporated herein by reference.

FIELD

The embodiments discussed herein are directed to a package substrate unit and a method for manufacturing the package substrate unit.

BACKGROUND

Traditionally, package wiring substrates that are configured to have high density by means of a multilayer structure have been in demand. In that regard, as a wiring substrate configured to have a multilayer and high-density structure, a buildup substrate is known that includes interstitial vias (IVHs) formed in a core layer for establishing an electrical connection between specific layers, IVH pads formed on the core layer, vias formed in a buildup layer, via pads formed on the buildup layer, and wiring patterns. Such a multilayer buildup substrate is also known to function as a package substrate unit.

Explained below with reference to FIG. 19 is an exemplary configuration of a conventional package substrate unit 100 having a multilayer structure. Herein, FIG. 19 is a configuration diagram of the conventional package substrate unit 100. FIG. 20A is a cross-sectional view of a conventional semiconductor chip mounting layer. FIG. 20B is a plan view of the conventional semiconductor chip mounting layer.

As illustrated in FIG. 19, the package substrate unit 100 includes a semiconductor chip mounting layer 3, a ball grid array (BGA) solder ball mounting layer 19, an insulation layer 4 (FIG. 20A), and an insulation layer 5. Besides, it is formed to have a multilayer buildup structure that includes insulation layers 14 functioning as topside and underside buildup layers respectively and each having vias 12 and via pads 13, a core layer 15, and solder resist layers 7 and 16.

In the core layer 15, through holes 17 are formed at predetermined positions. In each through hole 17 is placed a through hole via 18 with a pair of the via pads 13 lying above and below. Besides, in the package substrate unit 100, a semiconductor chip 10 is mounted as an electronic component on the top surface of the semiconductor chip mounting layer 3.

The semiconductor chip mounting layer 3 includes the insulation layer 4 (FIG. 20A), conductive pads 6 and the solder resist layer 7 that are formed on the top surface of the insulation layer 4. On the solder resist layer 7, openings 8 that are located at the upper side are formed at predetermined positions (FIG. 19). Solder bumps 11 that are formed at the end terminals of the semiconductor chip 10 form solder joints with solder bumps 9 that are formed at the openings 8, which are formed on the solder resist layer 7 of the semiconductor chip mounting layer 3. Herein, eutectic solder (Sn/Pb) is used in the solder bumps 9.

Meanwhile, in a publication that discloses a conventional technology, a package substrate has been disclosed in which copper posts and copper bumps functioning as electroplating electrodes for forming solder joints with the copper posts are provided in solder bumps that are formed on a base resin layer on which an electronic component such as a semiconductor chip is mounted.

Patent Literature 1: Japanese Laid-open Patent Publication No. 2008-42118

In recent years, from the perspective of environmental measures, there has been a shift from eutectic solders (Sn/Pb) to lead-free solders not containing lead (Pb) (for example, Sn/Ag, Sn/Ag/Cu, Sn/Cu, etc.) as the solders used at the time of mounting semiconductor chips.

Here, lead-free solders have a higher melting-point temperature (for example, 220° C.) than the melting-point temperature (for example, 183° C.) of eutectic solders. Hence, the difference in thermal expansion at the time of mounting the semiconductor chip 10 in the package substrate unit 100 (i.e., during the reflow process) causes lead-free solders to be prone to strain. Besides, since the lead-free solders have a higher degree of hardness than eutectic solders, the lead-free solders are more prone to cracks than the eutectic solders.

Explained below with reference to FIGS. 20A and 20B are the factors causing cracks in the solder bumps 9 if lead-free solders are used. Herein, the stress on each solder bump 9 is generated at the interfaces between different materials. More particularly, the stress occurs at the interfaces (indicated by black circles α in the figure) between the solder bumps 9 and the respective openings 8 on the solder resist layer 7 and occurs at the interfaces (indicated by black circles β in the figure) between the conductive pads 6 and the respective solder bumps 9.

Particularly, since the stress gets concentrated at the interfaces between the solder bumps 9 and the respective openings 8 on the solder resist layer 7, cracks occur from the interfaces (indicated by black circles a in the figure) between the solder bumps 9 and the respective openings 8 on the solder resist layer 7 toward the central portion of the solder bumps 9. When such cracks occurs inside the solder bumps 9, it effects the connection strength between the solder bumps 9 and the respective solder bumps 11, which are formed at the end terminals of the semiconductor chip 10 (FIG. 19).

Meanwhile, in the case of the package substrate disclosed in the conventional technology publication, since the copper posts are formed in the through hole of a base resin layer, the substrate cannot be configured to be a high density substrate. Moreover, in order to form the copper bumps that form solder joints with the copper posts, it is necessary to perform the task of forming openings in the base resin layer by using an expensive laser machine. Besides, it is also necessary to perform the task of uniting or aligning the base resin layer having the copper posts formed thereon with a substrate having solders printed thereon.

SUMMARY

According to an aspect of an embodiment of the invention, a package substrate unit includes an insulation layer; and an electrode unit that is formed on the insulation layer to establish an electrical joint, via a solder, with an end terminal of an electronic component positioned opposite to the insulation layer, wherein the electrode unit has a protrusion that protrudes toward the electronic component.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Preferred embodiments of the present invention will be explained with reference to accompanying drawings.

[a] First Embodiment

Figure 1:
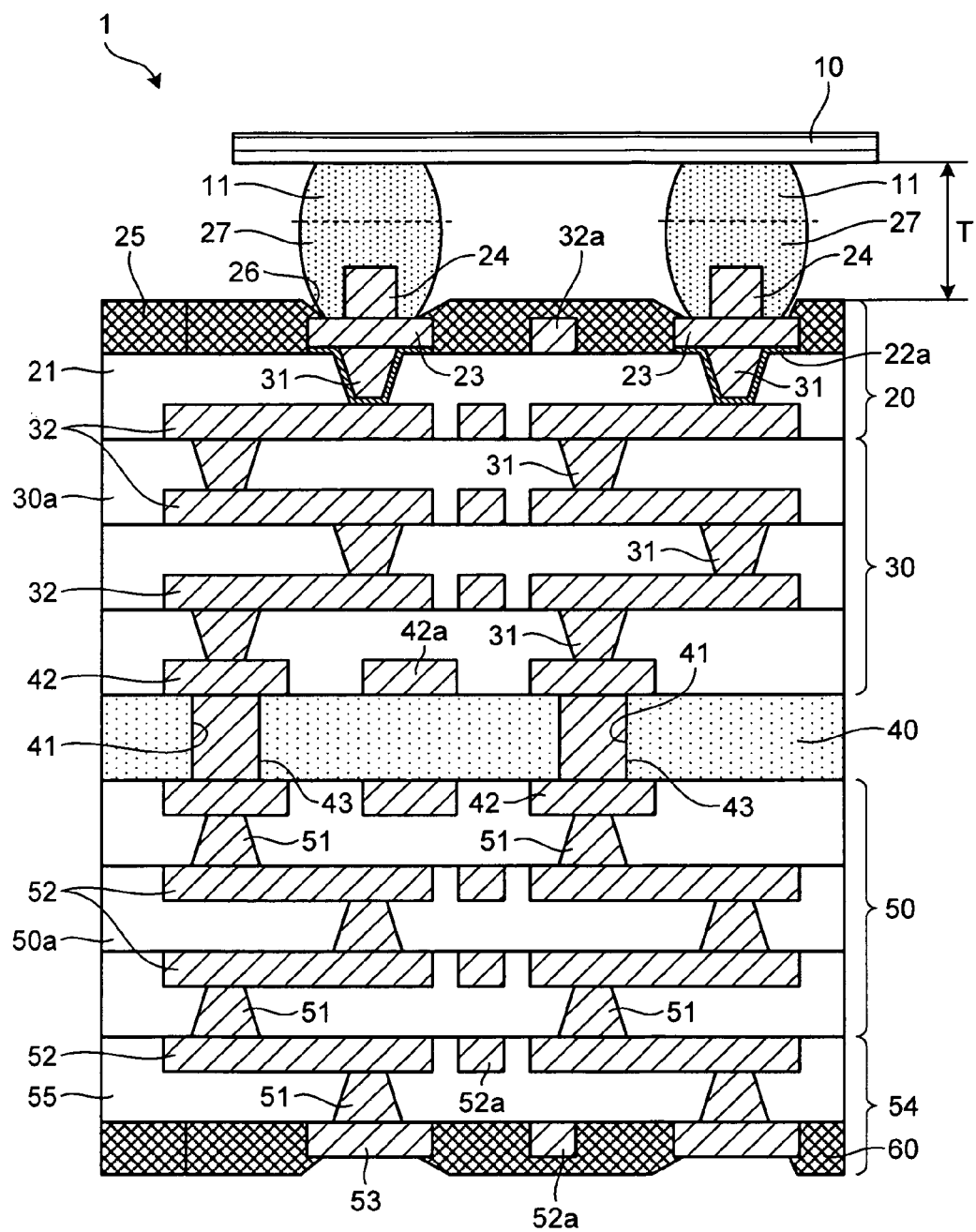
FIG. 1 is a cross-sectional view of a package substrate unit according to a first embodiment.
Figure 2A:
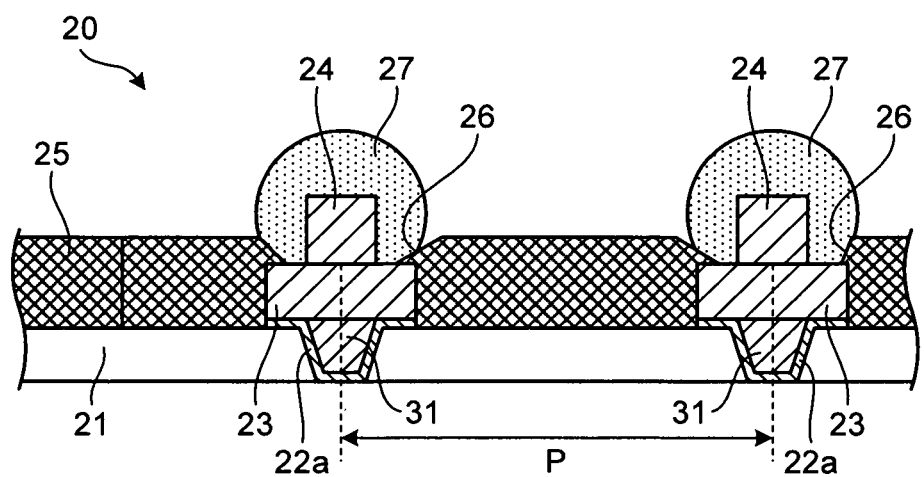
FIG. 2A is a cross-sectional view of a semiconductor chip mounting layer according to the first embodiment.
Figure 2B:
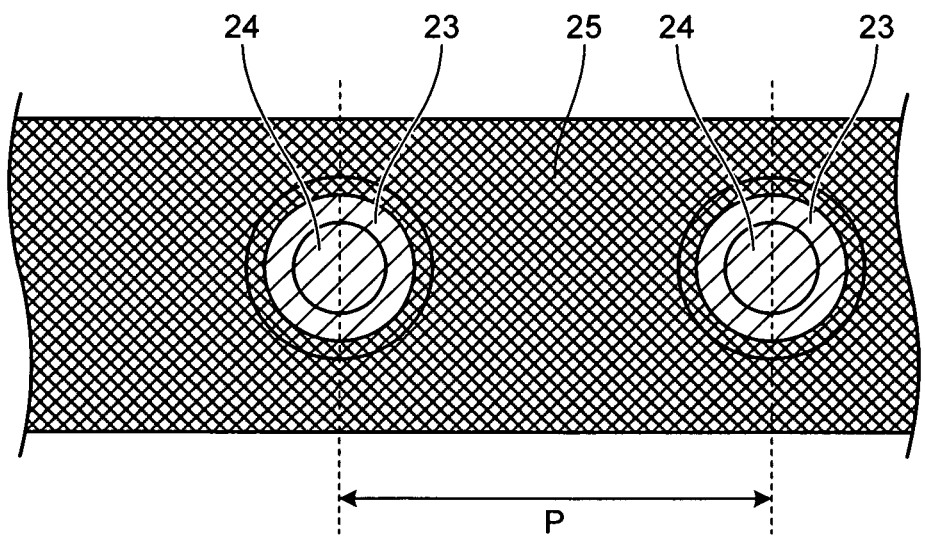
FIG. 2B is a plan view of the semiconductor chip mounting layer according to the first embodiment.
Figure 3:
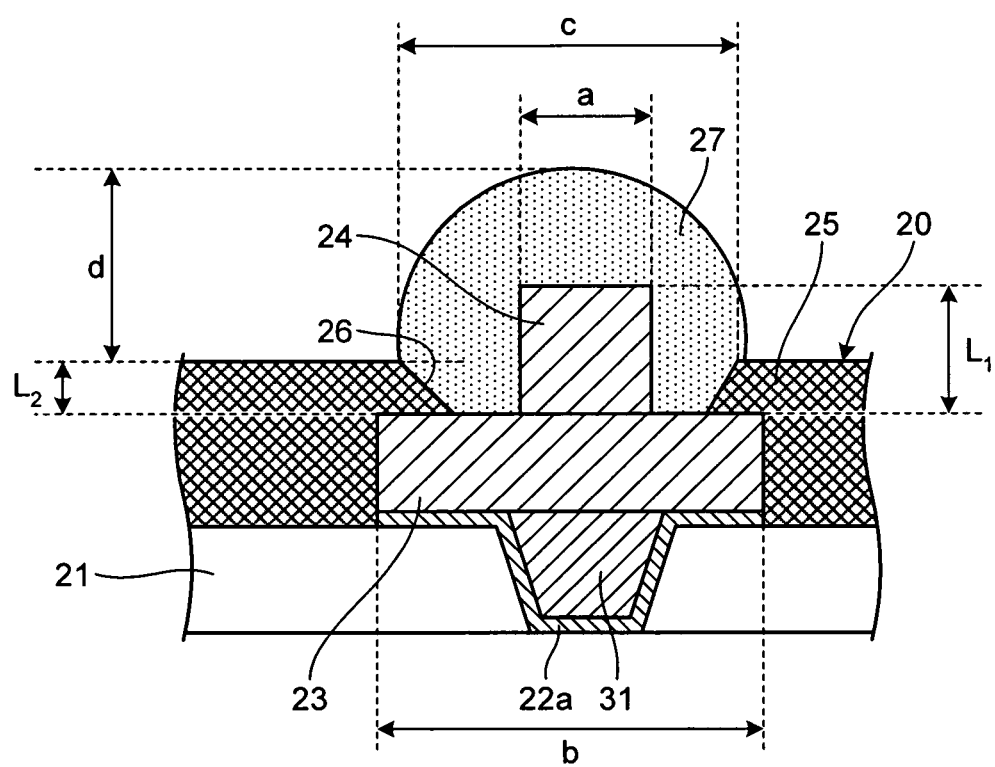
FIG. 3 is an explanatory diagram for explaining exemplary dimensions of the constituent elements of the semiconductor chip mounting layer.

FIG. 1 is a cross-sectional view of a package substrate unit according to a first embodiment. FIG. 2A is a cross-sectional view of a semiconductor chip mounting layer according to the first embodiment. FIG. 2B is a plan view of the semiconductor chip mounting layer according to the first embodiment. FIG. 3 is an explanatory diagram for explaining exemplary dimensions of the constituent elements of the semiconductor chip mounting layer.

Meanwhile, the present invention is not limited to the present embodiment. Besides, in the example illustrated in diagrams, a buildup structure is configured from two buildup layers. However, alternatively, it is also possible to configure the buildup structure with more than two layers, which include a semiconductor chip mounting layer 20 having metal posts 24 formed thereon according to the first embodiment. In the following description according to the first embodiment, it is assumed that the semiconductor chip 10 is mounted on the top surface of a package substrate unit 1.

As illustrated in FIG. 1, the package substrate unit 1 includes the semiconductor chip mounting layer 20, a BGA solder ball mounting layer 54, topside buildup layers 30 with vias 31 and via pads 32 formed thereon, a core layer 40, and underside buildup layers 50 with vias 51 and via pads 52 formed thereon. On the core layer 40, through holes 41 are formed at predetermined positions. In each through hole 41 is placed a through hole via 43 with a pair of via pads 42 lying above and below. Besides, wirings 42a are formed on the core layer 40.

In the package substrate unit 1, the semiconductor chip mounting layer 20 is formed that includes an insulation layer 21 and the BGA solder ball mounting layer 54 is formed that includes an insulation layer 55. The package substrate unit 1 is configured to have a multilayer structure by establishing electrical connections between the vias 31 as well as the via pads 32 formed on the topside buildup layers 30, the core layer 40, and the via pads 42 as well as the through hole vias 43 formed on the core layer 40, and by establishing electrical connections between the vias 51 as well as the via pads 52 formed on the underside buildup layers 50, the core layer 40, and the via pads 42 as well as the through hole vias 43 formed on the core layer 40. Besides, the semiconductor chip 10 is mounted as an electronic component on the top surface of the semiconductor chip mounting layer 20.

As illustrated in FIGS. 2A and 2B, the semiconductor chip mounting layer 20 includes the insulation layer 21, includes a conductive seed metal layer 22a that is formed on the top surface of the insulation layer 21 and around the vias 31, includes conductive pads 23 that are formed on the top surface of the conductive seed metal layer 22a, and includes the metal posts 24 that are formed at the substantially central portion of the top surface of the conductive pads 23. Besides, the semiconductor chip mounting layer 20 includes a solder resist layer 25 that is formed to surround the conductive pads 23 and the metal posts 24. On the solder resist layer 25, openings 26 that is located at the upper side are formed at predetermined positions (at two positions in FIGS. 2A and 2B).

Moreover, at the formation positions of the openings 26 on the solder resist layer 25, the metal posts 24 that are formed on the top surface of the respective conductive pads 23 become exposed as well as the solder bumps 27 (FIG. 1) that form solder joints with the solder bumps 11 (FIG. 1), which are formed at the end terminals of the semiconductor chip 10 (FIG. 1).

The conductive seed metal layer 22a lies between the insulation layer 21 and the bottom surface of the solder resist layer 25 as well as the bottom surfaces of the conductive pads 23.

Thus, the conductive seed metal layer 22a is formed with the aim of enhancing the electrical conductivity for the conductive pads 23 and the metal posts 24, enhancing the contact with the insulation layer 21, and enhancing the connection reliability.

The conductive pads 23 are formed as round shaped pad members and are made of the same material (for example, copper) as the material of the metal posts 24 formed on the top surface of the conductive pads 23. Moreover, the conductive pads 23 along with the respective metal posts 24 function as electrode units for establishing electrical connections with the end terminals of the semiconductor chip 10. Meanwhile, the conductive pads 23 are also known as controlled collapse chip connection (C4) pads.

Each metal post 24 is made of copper material and is formed as a columnar post having upward orientation at the substantially central portion of the corresponding conductive pad 23. Specifically, each metal post 24 is formed at the position at which the corresponding opening 26 is formed on the solder resist layer 25 and at which it supports from inside the height of the solder bump 27 formed at the same opening 26. Thus, the solder bumps 27 are printed around the respective openings 26 formed on the solder resist layer 25 as well as printed around the respective metal posts 24.

Thus, in the first embodiment, a mounting height T (FIG. 1) between the semiconductor chip 10 and the package substrate unit 1 can be maintained at a predetermined height. Specifically, in the package substrate unit 1 according to the first embodiment in which the conductive pads 23 (C4 pads) of finer or narrower pitch, the mounting height T between the semiconductor chip 10 and the package substrate unit 1 can be maintained at a predetermined height by having the metal posts inside the solder bumps. That makes it possible to prevent the occurrence of strain in the solder bumps 27.

Figure 19:
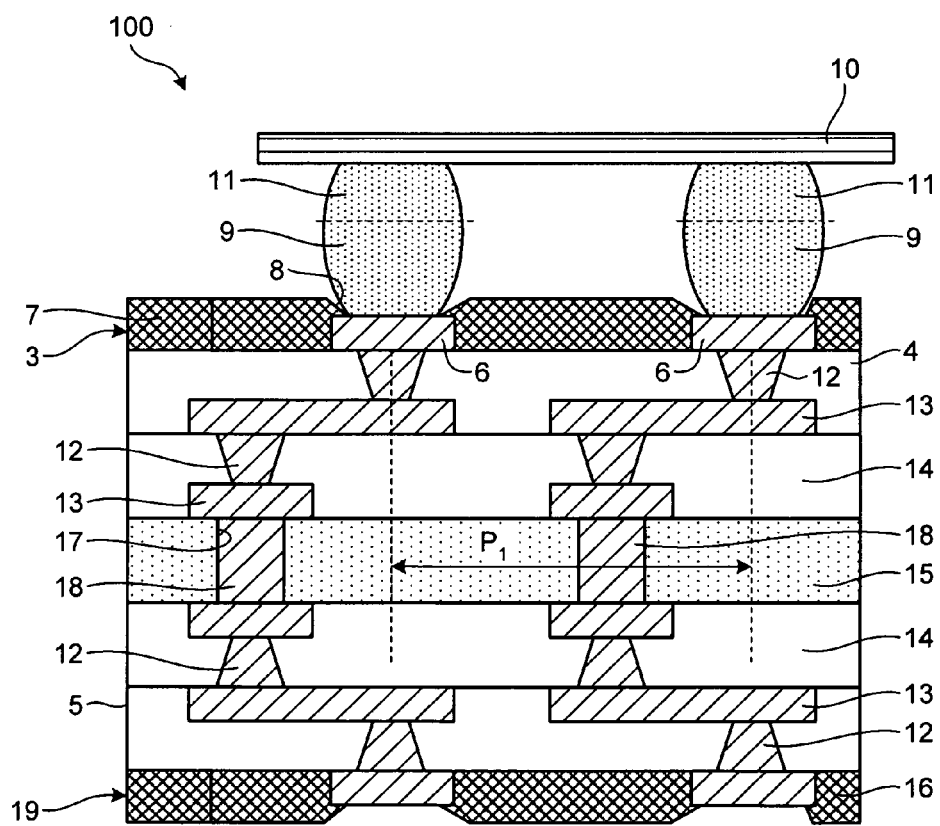
FIG. 19 is a configuration diagram of a conventional package substrate unit.
Figure 20A:
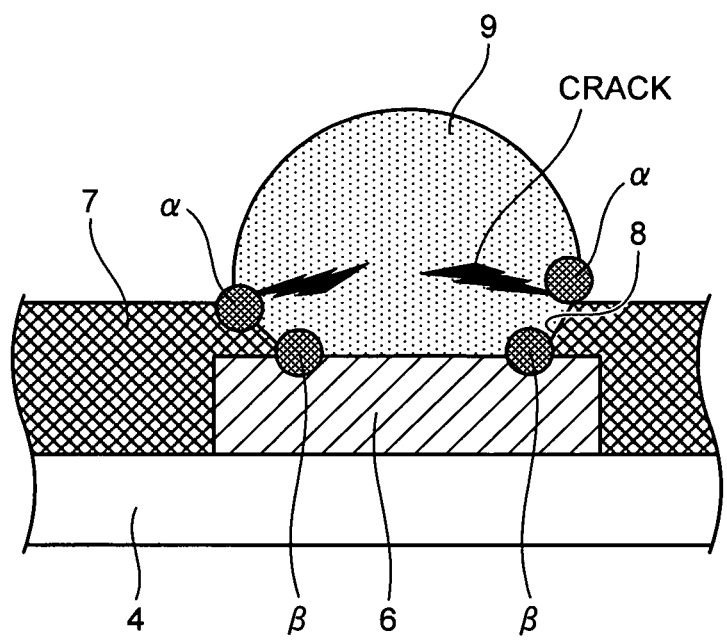
FIG. 20A is a cross-sectional view of a conventional semiconductor chip mounting layer.
Figure 20B:
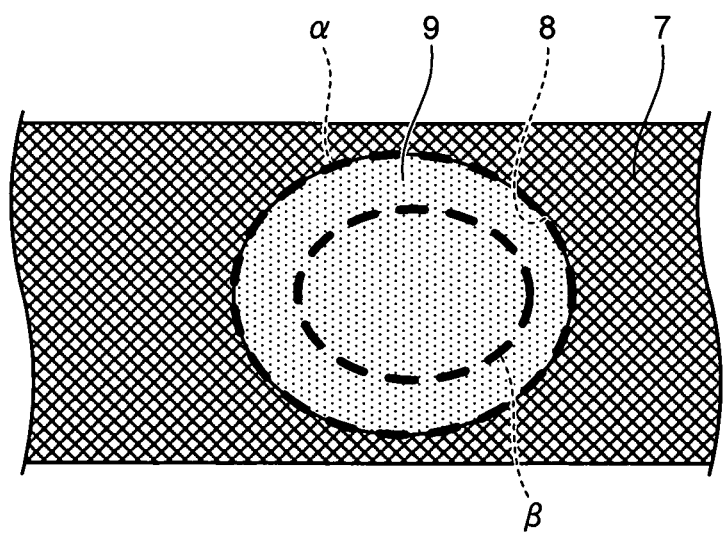
FIG. 20B is a plan view of the conventional semiconductor chip mounting layer.

Moreover, since, in each solder bump 27, the metal post 24 is formed in order to support from inside the height of that solder bump 27, the solder amount of the solder bump 27 can be reduced equivalent to the volume of the corresponding metal post 24. As a result, as compared to the semiconductor chip mounting layer 3 (FIG. 19) according to the conventional technology, it is possible to reduce the pitch P between the conductive pads 23 (pitch $P_1$>pitch P). Consequently, narrowing of the pitch enables achieving the high density solder bumps.

Herein, in the first embodiment, the metal posts 24 are formed to be columnar in shape for the purpose of increasing the effect of stress dispersion. Alternatively, it is also possible to form the metal posts 24 as quadrangular posts, as octagonal posts, as polygonal posts, or as rod-like protrusions.

FIG. 3 illustrates exemplary dimensions of the constituent elements of the semiconductor chip mounting layer 20. Specifically, in FIG. 3 are illustrated a diameter dimension "a" of each metal post 24, a diameter dimension "b" of each conductive pad 23, and a diameter dimension "c" of the solder resist layer 25. Besides, FIG. 3 illustrates a height dimension $L_1$ of each metal post 24, a height dimension "d" of each solder bump 27, a height dimension $L_2$ of the solder resist layer 25, and the pitch P between the conductive pads 23. Meanwhile, the numerical values illustrated in FIG. 3 represent the ratio when each opening 26 formed on the solder resist layer 25 is suggested to have the diameter dimension of "1".

That is, as illustrated in FIG. 3, each metal post 24 is a columnar post having the diameter dimension "a" in the range of 0.5 to 0.7. Each conductive pad 23 has the diameter dimension "b" in the range of 1.3 to 1.5. Each opening 26 formed on the solder resist layer 25 has the diameter dimension "c" equal to 1.0. Meanwhile, each metal post 24 has the height dimension $L_1$ in the range of 0.3 to 0.7. Each solder bump 27 has the height dimension "d" in the range of 0.1 to 0.83. The solder resist layer 25 has the height dimension $L_2$ in the range of 0.2 to 0.33. Consequently, each metal post 24 gets exposed at positions higher than the solder resist layer 25. Meanwhile, the pitch P between the conductive pads 23 is in the range of 2 to 1.3.

In the present embodiment, the height dimension $L_1$ of the metal posts 24 is configured to be higher than the height dimension $L_2$ of the solder resist layer 25 (height dimension $L_1$>height dimension $L_2$). By having such a configuration, it becomes possible to reliably prevent the occurrence of cracks that are attributed to the focusing or accumulation of stress inside the solder bumps 27.

In this way, by disposing each metal post 24 inside the corresponding solder bump 27 for the purpose of supporting that solder bump 27, it becomes possible to disperse the stress occurring inside that solder bump 27.

Figure 4A:
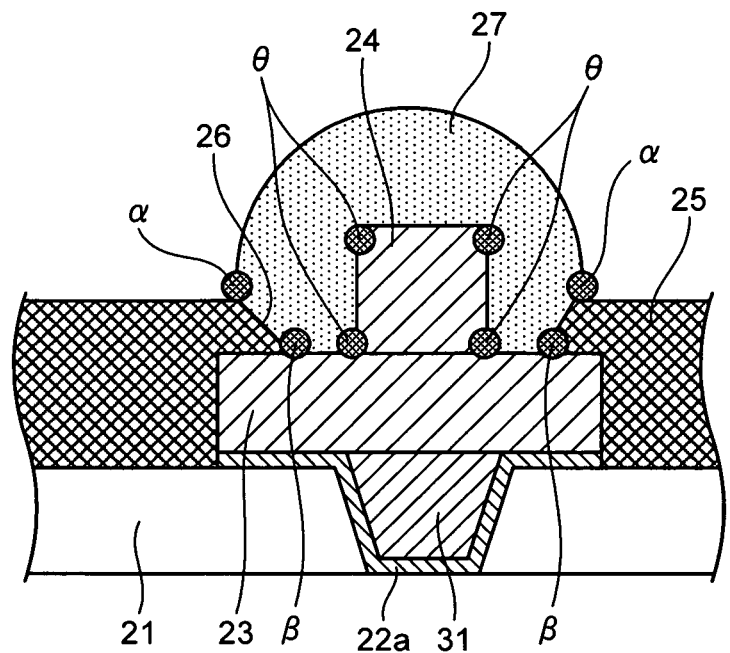
FIG. 4A is a cross-sectional view for explaining the stress distribution acting on a solder bump.
Figure 4B:
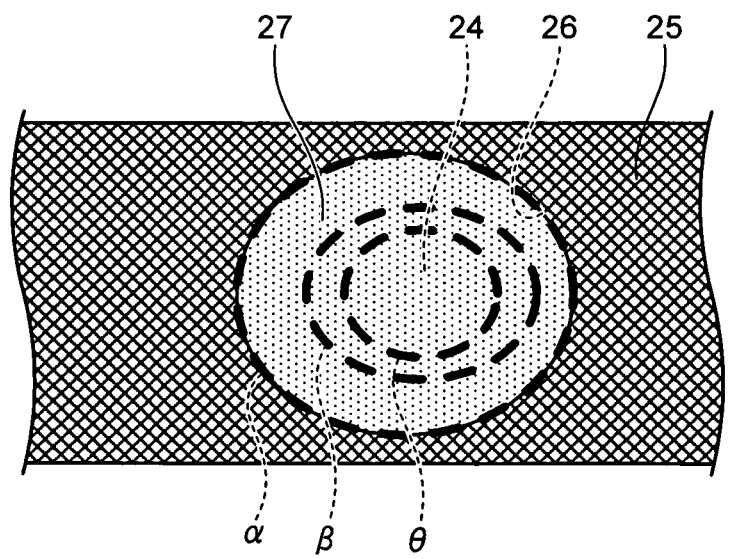
FIG. 4B is a plan view for explaining the stress distribution acting on a solder bump.

Explained below with reference to FIGS. 4A and 4B is the stress dispersion effect in which the stress occurring inside the solder bumps 27 gets dispersed with the use of the metal posts 24. FIG. 4A is a cross-sectional view for explaining the stress distribution acting on a solder bump. FIG. 4B is a plan view for explaining the stress distribution acting on a solder bump.

As described above, inside the solder bumps 27, the stress is generated at the interfaces between the solder bumps 27 and other different materials. Specifically, the stress occurs at the interfaces (indicated by black circle α in the figure) between the solder bumps 27 and the respective openings 26 on the solder resist layer 25 and occurs at the interfaces (indicated by black circle β in the figure) between the solder bumps 27 and the respective conductive pads 23. On the other hand, in the first embodiment, since the metal posts 24 are formed at the substantially central portion inside the respective solder bumps 27, the stress also occurs at the interfaces (indicated by black circle θ in the figure) between the solder bumps 27 and the respective metal posts 24.

Specifically, at the interfaces between the solder bumps 27 and the respective openings 26 formed on the solder resist layer 25, there exists a large difference in hardness between the solder resist layer 25 and the solder bumps 27. Hence, cracks tend to occur by the stress focusing or accumulation at those interfaces. On the other hand, at the interfaces between the solder bumps 27 and the respective metal posts 24, there exists a small difference in hardness between the metal posts 24 and the solder bumps 27. Hence, the stress does not focus or accumulate at those interfaces and there is no occurrence of cracks.

Thus, regarding the stress occurring in the solder bumps 27, in addition to the interfaces between the solder bumps 27 and the respective openings 26 formed on the solder resist layer 25 where the stress occurs conventionally, the stress is also generated at the interfaces (indicated by black circle θ in the figure) between the solder bumps 27 and the respective metal posts 24. As a result, the stress gets dispersed in such a way that the amount of stress focusing on a single location decreases. Hence, the metal posts 24 facilitate an increase in the number of stressful locations so that the cracks that essentially occur due to the strain by the stress can be prevented from occurring.

Reliability Test for Solder Bumps with Metal Posts

Figures 5, 6:
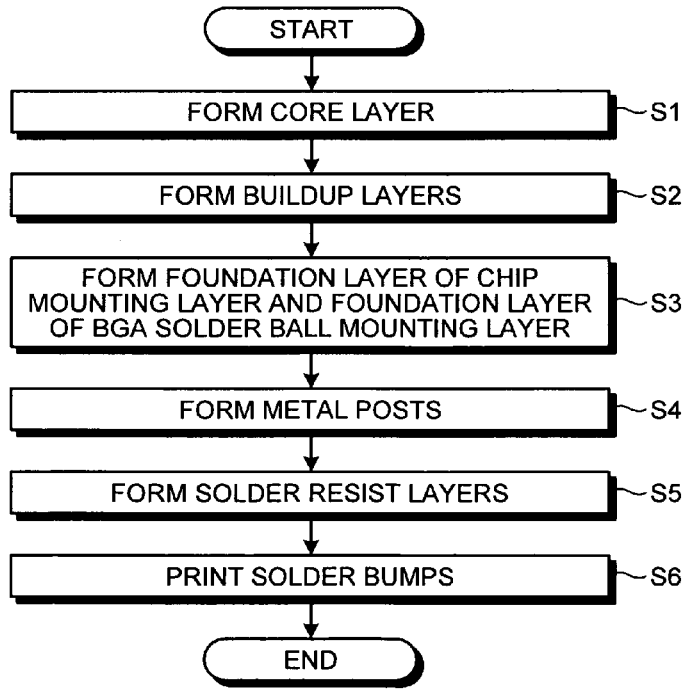
FIG. 5 is a diagram for explaining a reliability test regarding solder bumps.
FIG. 6 is a flow chart for explaining a method for manufacturing the package substrate unit.

FIG. 5 is a table for explaining a reliability test regarding the solder bumps 27 with the respective metal posts 24. Herein, the reliability result regarding the solder bumps 27 as illustrated in FIG. 5 depends on the ratio of the height dimension $L_2$ of the solder resist layer 25 (FIG. 3) and the height dimension $L_1$ of the metal posts 24.

Herein, 20 samples of the package substrate unit were tested. Moreover, the numerical values (<1, 1.5 to 1.7, 2.1, 2.6, 4.0, and 4.1) used under Condition 1 to Condition 8 represent the ratio with the height dimension of the metal posts 24 where the height dimension of the solder resist layer 25 is suggested as "1". Furthermore, the temperature of a thermal cycle test known as TCB is set in the range of −55° C. to +125° C. Under all conditions except Condition 1, all of the samples passed TCB 3500 cycles and no cracks were found to have occurred.

Specifically, when the height dimension $L_1$ of the metal posts 24 is set to be higher than the height dimension of "1" of the solder resist layer 25 (e.g., Conditions 2~8), all samples passed TCB 3500 cycles. the contrary, when the height dimension of the metal post L1 is lower than the height dimension of solder resist layer 25 (e.g., Condition 1), cracks occurred inside the solder bumps 27 after TCB 1000 cycles.

Under each of Condition 2 to Condition 8, when the height dimension L1 of the metal posts 24 is set to 1.5 to 1.7, 2.1, 2.6, 4.0, and 4.1, respectively, an evaluation experiment result was obtained in which the occurrence of cracks was not found inside the solder bumps 27 of any of the 20 samples. In this way, when the height dimension $L_1$ of the metal posts 24 is set to be higher than the height dimension $L_2$ of the solder resist layer 25, the cracks that essentially occur due to the concentration of stress can be prevented from occurring inside the solder bumps 27.

Method for manufacturing package substrate unit Explained below with reference to FIG. 6 is a method for manufacturing the package substrate unit according to the first embodiment. Herein, FIG. 6 is a flow chart for explaining the method for manufacturing the package substrate unit according to the first embodiment.

As illustrated in FIG. 6, while manufacturing the package substrate unit, a substrate manufacturing system first forms the core layer 40 (FIG. 1) at Step S1. That is, firstly, the through holes vias 43 are formed in the core layer 40 followed by the formation of the via pads 42 and the wirings 42a.

Subsequently, the topside buildup layers 30 and the underside buildup layers 50 (FIG. 1) are simultaneously formed as the wiring layers on both sides of the core layer 40 (FIG. 1) at Step S2. Specifically, on the core layer 40, an insulation layer 30a and an insulation layer 50a are formed that respectively constitute the topside buildup layers 30 and the underside buildup layers 50. Then, the vias 31, the via pads 32, and wirings 32a are formed as part of the topside buildup layers 30. Similarly, the vias 51, the via pads 52, and wirings 52a are formed as part of the buildup layers 50 under the core layer 40. The operation of forming the vias 31 and 51, forming the via pads 32 and 52, and forming the wirings 32a and 52a is repeated until the necessary number of layers is attained. Meanwhile, except the formation of the insulation layers, the formation of layers at Step S2 is performed for the purpose of establishing electrical connections among the layers. Moreover, the operation at Step S2 results in the formation of a wiring layer as the inside layer between the core layer and the semiconductor chip mounting layer.

Subsequently, a foundation layer of the semiconductor chip mounting layer 20 (FIG. 1) and a foundation layer of the BGA solder ball mounting layer 54 (FIG. 1) are formed at Step S3. Herein, the foundation layer of the semiconductor chip mounting layer 20 is formed on the topside of the buildup layers 30 formed at Step S2; while the foundation layer of the BGA solder ball mounting layer 54 is formed on the underside of the buildup layers 50 formed at Step S2. More particularly, the insulation layer 21 and the insulation layer 55 are formed on the patterns of the inside layer. Then, before the formation of the vias 31 and the vias 51 for the purpose of establishing electrical connections, a conductive seed metal layer 22 (FIG. 7A) is formed. Consequently, the vias 31 and the vias 51 are filled with electrolytic plating. Then, the conductive pads 23 are formed, which represent the electrode units for establishing electrical connections with the end terminals of the semiconductor chip 10 at the positions immediately above the vias 31, and the wirings 32a are formed. Similarly, BGA pads 53 are formed, which represent the electrode units at the positions immediately below the vias 51, and the wirings 52a are formed.

Subsequently, the metal posts 24 are formed on the top surface of the conductive pads 23 at Step S4. As described later, at Step S4, the metal posts 24 are formed on the top surface of the conductive pads 23 for the purpose of supporting from inside the solder bumps 27, which form solder joints with the solder bumps 11 formed on the semiconductor chip 10. That is followed by the formation of the solder resist layer 25 and a solder resist layer 60 at Step S5.

At Step S5, the solder resist layer 25 is formed for the purpose of forming the openings 26 at which the metal posts 24 are disposed. Specifically, by opening the solder resist layer 25 by means of photolithography and development, the openings 26 are formed thereon. At the same time, the solder resist layer 60 is formed for the purpose of forming openings at which BGA solder balls are mounted.

Subsequently, printing of the solder bumps is carried out at Step S6. At Step S6, the solder bumps 27 that are lead-free solders are printed at the openings 26, which formed on the solder resist layer 25, and printed on the top surface of the metal posts 24.

Explained below with reference to FIGS. 7A to 7J are the details of the manufacturing process of the package substrate unit. FIGS. 7A to 7J are explanatory diagrams for explaining the procedure followed while manufacturing the package substrate unit according to the first embodiment. Meanwhile, the manufacturing process of the package substrate unit is performed by implementing a predetermined substrate manufacturing system. The following description is given with reference to the exemplary case of implementing the substrate manufacturing system.

Figure 7A:
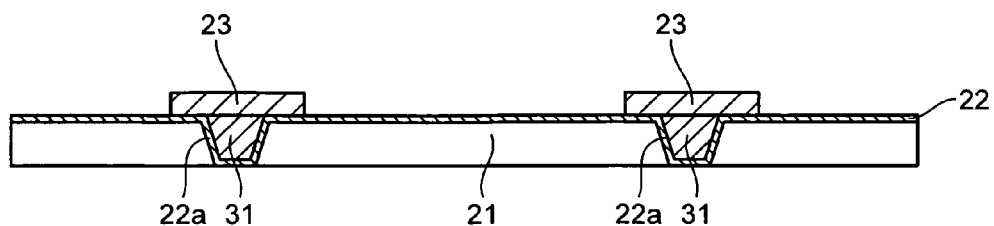
FIGS. 7A to 7J are explanatory diagrams for explaining the method of manufacturing the package substrate unit.

As illustrated in FIG. 7A, firstly, the conductive seed metal layer 22 is formed by electroless plating before filling the vias 31 with electrolytic plating in the insulation layer 21 constituting the semiconductor chip mounting layer 20 (FIG. 1).

Although the conductive seed metal layer 22 is etched out at a latter stage (FIG. 7F), it remains intact only at the bottom part of the conductive pads 23 and around the vias 31. As described above, the conductive seed metal layer 22a remaining at the bottom part of the conductive pads 23 and around the vias 31 becomes a significant connection seed metal layer between the conductive pads 23 and the insulation layer 21 as well as between the vias 31 and the insulation layer 21. Thus, the conductive seed metal layer 22a makes the conductive pads 23 and the vias 31 stick together with the insulation layer 21.

Specifically, vias are formed at predetermined positions on the insulation layer 21 and the surface of the insulation layer 21 is roughened. Subsequently, electroless plating is performed to form the conductive seed metal layer 22, which is a metallic plating seed layer, on the surface of the insulation layer 21. The conductive seed metal layer 22 is used as the conductive layer and vias 31 are filled up by the electrolytic plating until the via lid plating layer is formed. Moreover, the lid plating layer is patterned to form the conductive pads 23 and the wirings 32a by the photolithographic method. As described above, the conductive pads 23 represent the electrode units for establishing an electrical connection with the semiconductor chip 10.

Figure 7B:
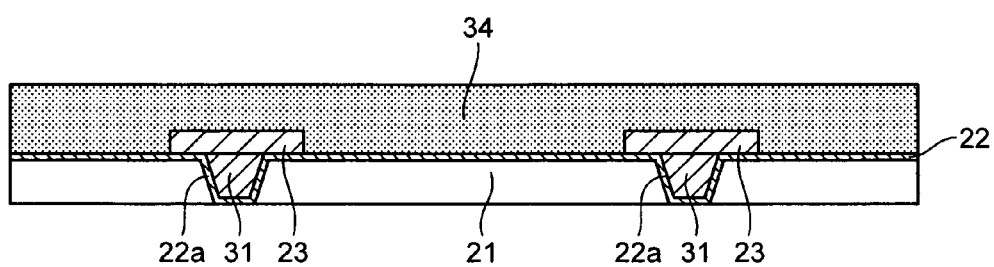

Subsequently, as illustrated in FIG. 7B, a dry film resist layer 34 having a predetermined thickness is formed using a dry film resist on the surface of the copper patterning layer on which the conductive pads 23 have been formed. The dry film resist layer 34 is formed in a laminated manner on the semiconductor chip mounting layer 20.

Figure 7C:
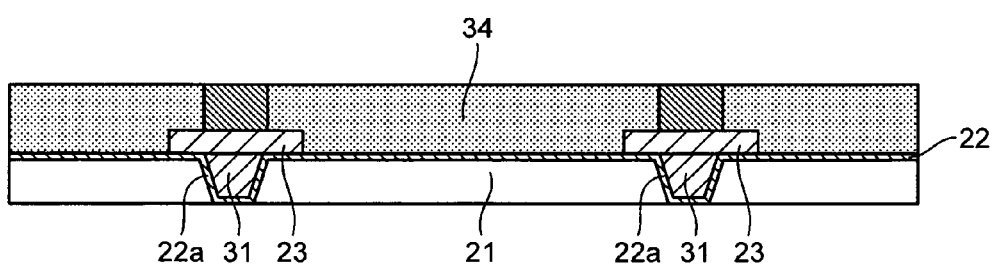

Subsequently, as illustrated in FIG. 7C, an photolithography process is performed to expose predetermined regions on the dry film resist layer 34. Specifically, the photolithography of the dry film resist is performed by the photomask so that the patterns for forming the metal posts 24 are transferred on those regions on the dry film resist layer 34 that lie above the top surface of the conductive pads 23. Thus, the predetermined regions exposed during the photolithography process correspond to the locations at which the metal posts 24 are formed.

Figure 7D:
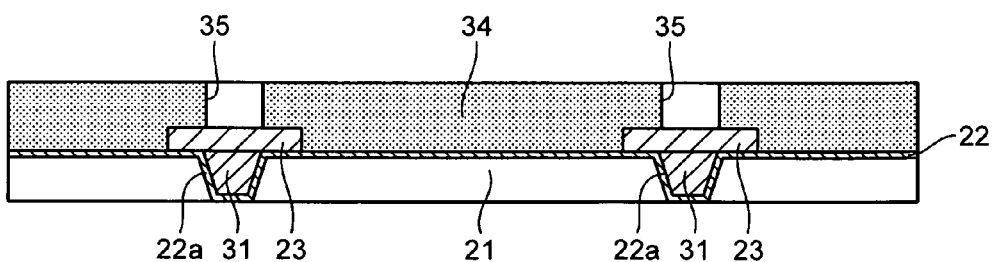

Subsequently, as illustrated in FIG. 7D, a development process is performed with respect to those predetermined regions on the dry film resist layer 34 that have been exposed during the photolithography process (regions corresponding to post openings). As a result of the development process, openings 35 to be used for forming the metal posts 24 are formed at the predetermined locations on the dry film resist layer 34. As illustrated in FIG. 7D, the openings 35 are columnar in shape.

Figure 7E:
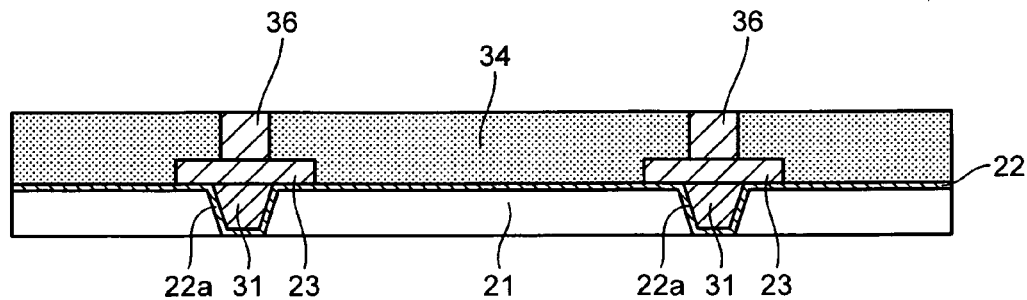

Subsequently, as illustrated in FIG. 7E, plating process is performed with respect to the regions subjected to the development process. More particularly, the metal is electrolytically plated to fill the openings 35 formed as a result of the development process. By filling in the openings 35, the metal posts 24 in columnar shape is formed on the top surface of the conductive pads 23.

Meanwhile, in the first embodiment, in order to form the metal posts 24 on the top surface of the conductive pads 23, a semi-additive method using a dry film resist is implemented. Alternatively, the metal posts 24 can also be manufactured by implementing a subtractive method.

Figure 7F:
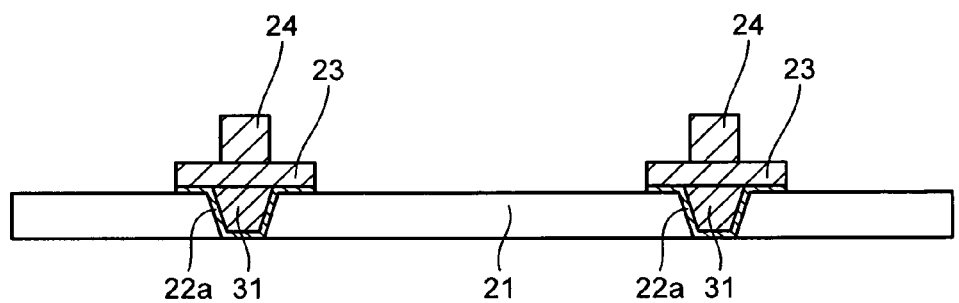

Subsequently, as illustrated in FIG. 7F, the dry film resist layer 34 formed on the top surface of the insulation layer 21 is stripped off. While stripping off the dry film resist layer 34, as illustrated in FIG. 7F, the conductive seed metal layer 22 is also etched off except that remains under the conductive pads 23. As described above, the conductive seed metal layer 22a remaining at the bottom part of the conductive pads 23 and around the vias 31 becomes a significant connection seed metal layer between the conductive pads 23 and the insulation layer 21 as well as between the vias 31 and the insulation layer 21.

Figure 7G:
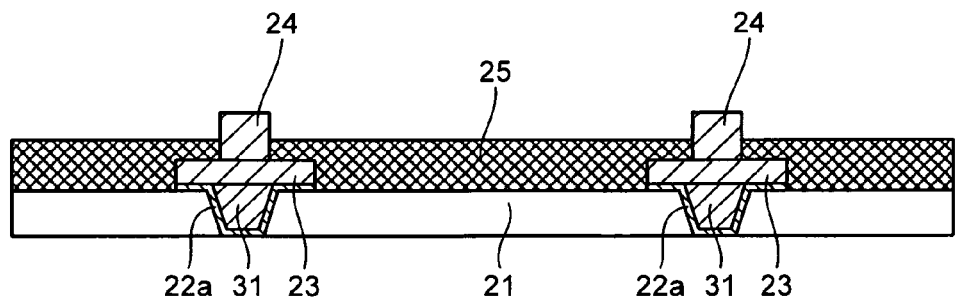

Subsequently, as illustrated in FIG. 7G, the solder resist layer 25 is formed to surround the conductive pads 23 and the metal posts 24, which are formed on the top surface of the insulation layer 21. In this case, the formation position (height dimension $L_2$) of the solder resist layer 25 is set to be lower than the height dimension $L_1$ of the metal posts 24. That is because, as described above, when the height dimension $L_1$ of the metal posts 24 is set to be higher than the height dimension $L_2$ of the solder resist layer 25, the cracks that occur due to the strain caused by the accumulation of the stress can be prevented from occurring inside the solder bumps 27.

Figure 7H:
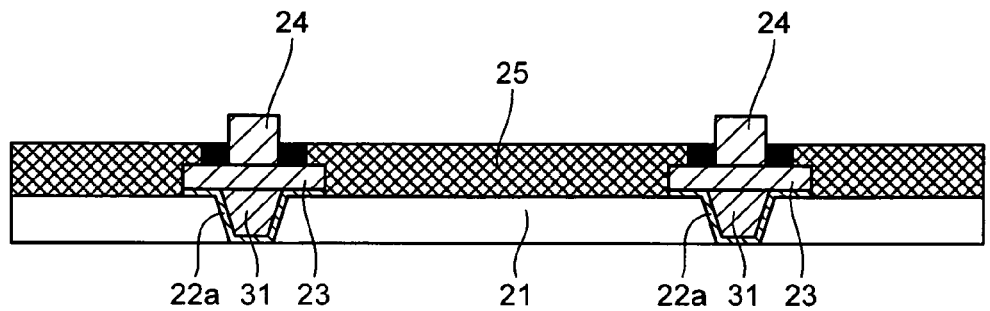

Subsequently, as illustrated in FIG. 7H, the solder resist layer 25 formed on the top surface of the conductive pads 23 and around the metal posts 24 is exposed using a photomask.

Figure 7I:
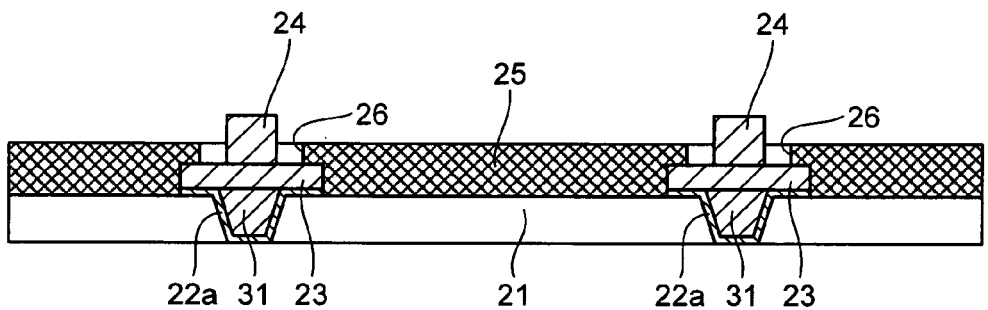

Then, as illustrated in FIG. 7I, the development process is performed for the solder printing opening around the metal posts 24. More particularly, the top surface of the conductive pads 23 and the surrounding area of the metal posts 24 are developed. Thus, the predetermined regions on the solder resist layer 25 that have been developed become the openings 26 at which the solder bumps 27 are printed to form solder joints with the solder bumps 11.

Figure 7J:
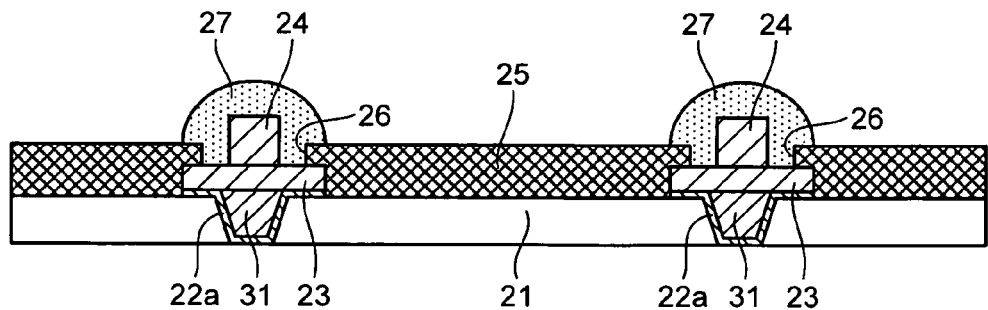

Subsequently, as illustrated in FIG. 7J, the solder bumps 27, which are the lead-free solders, are printed around the metal posts 24 located in the center of the openings 26 formed on the solder resist layer 25. In this way, according to the sequence explained with reference to FIG. 6 and FIGS. 7A to 7J, the package substrate unit 1 can be manufactured in which the metal posts 24 are formed to support from inside the height of the solder bumps 27 that are formed on the semiconductor chip mounting layer 20.

As described above, in the semiconductor chip mounting layer 20 constituting the package substrate unit 1 according to the first embodiment, the conductive seed metal layer 22a is formed on the top surface of the insulation layer 21 and the conductive pads 23 functioning as electrodes are formed on the top surface of the conductive seed metal layer 22a. The metal posts 24 that support the height of the solder bumps 27 are formed in the substantially central portion on the top surface of the conductive pads 23. The metal posts 24 enable achieving dispersion of the stress generated inside the solder bumps 27. Therefore, the cracks that essentially occur due to the accumulation of stress can be prevented from occurring inside the solder bumps 27.

As a result, it becomes possible to secure the connection reliability between the solder bumps 11 formed at the end terminals of the semiconductor chip 10 and the solder bumps 27 formed on the semiconductor chip mounting layer 20 in the package substrate unit 1. Besides, the pitch between the solder bumps 27 can be formed narrower by this metal posts structure and it enables high density solder bumps structure.

Explanations below with reference to FIGS. 8 to 18 are other examples of a semiconductor chip mounting layer constituting the package substrate units according to second to twelfth embodiments. In the following description of the second to twelfth embodiments, the constituent elements identical to the constituent elements of the semiconductor chip mounting layer 20 according to the first embodiment are referred to by the same reference numerals and the explanation thereof is not repeated.

[b] Second Embodiment

Figure 8:
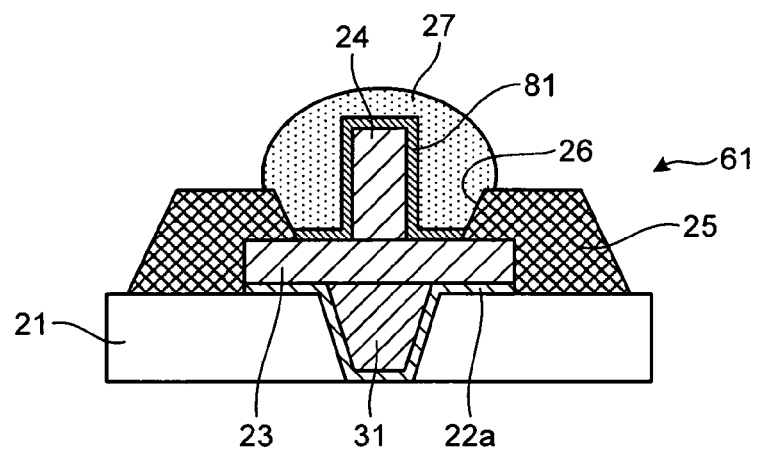
FIG. 8 is a cross-sectional view of a semiconductor chip mounting layer constituting the package substrate unit according to a second embodiment.

FIG. 8 is a cross-sectional view of a semiconductor chip mounting layer 61 constituting the package substrate unit according to the second embodiment. As illustrated in FIG. 8, in the semiconductor chip mounting layer 61 according to the second embodiment, surface treatment with heat resistant pre-flux processing using organic solderability preservatives (OSP) is performed on the surface of the metal posts 24, which are formed on the top surface of the conductive pads 23, and performed on a portion of the top surface of the conductive pads 23 so that a surface treatment layer 81 is formed.

Thus, in the second embodiment, by forming the surface treatment layer 81 on the surface of the metal posts 24 and on a portion of the top surface of the conductive pads 23, it becomes possible to remove the oxide film of the surface of the conductive pads 23 and that of the metal posts 24. Besides, it becomes possible to enhance the connection strength and the electrical conductivity between the surface of the metal posts 24 as well as the surface of the conductive pads 23 and the solder bumps 27 that are formed at the openings 26 on the solder resist layer 25.

[c] Third Embodiment

Figure 9:
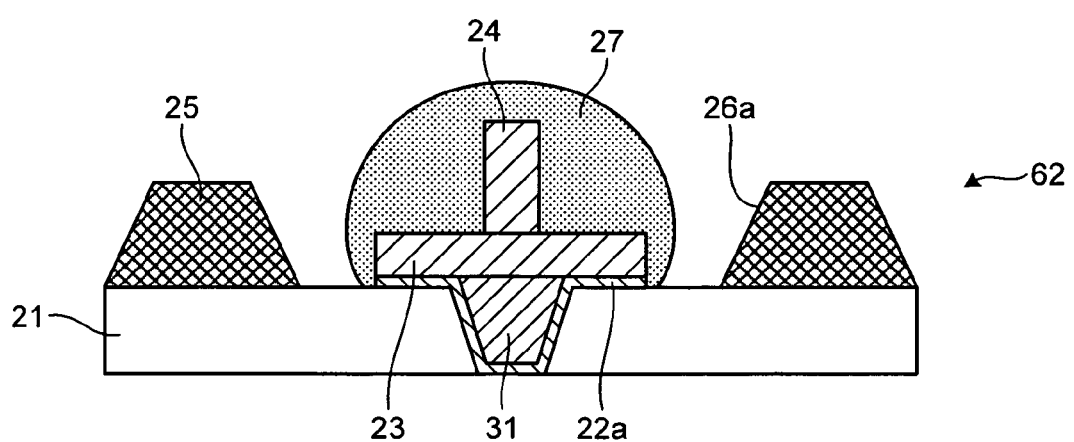
FIG. 9 is a cross-sectional view of a semiconductor chip mounting layer constituting the package substrate unit according to a third embodiment.

FIG. 9 is a cross-sectional view of a semiconductor chip mounting layer 62 constituting the package substrate unit according to the third embodiment. As illustrated in FIG. 9, in the semiconductor chip mounting layer 62 according to the third embodiment, openings 26a formed on the solder resist layer 25 are formed to be wider in dimension. Besides, the solder bumps 27, which form solder joints with the solder bumps 11 formed on the semiconductor chip 10, are formed in the shape of mushrooms.

Thus, in the third embodiment, such solder bumps 27 enable achieving enhancement in the electrical conductivity of the solder bumps 27 and the conductive pads 23 with respect to the semiconductor chip 10. Besides, since the solder bumps 27 with the metal posts 24 do not make contact with the openings 26a formed on the solder resist layer 25, the number of contact boundary points decreases. As a result, the cracks that essentially occur due to the stress focusing on the contact points can be prevented from occurring.

[d] Fourth Embodiment

Figure 10:
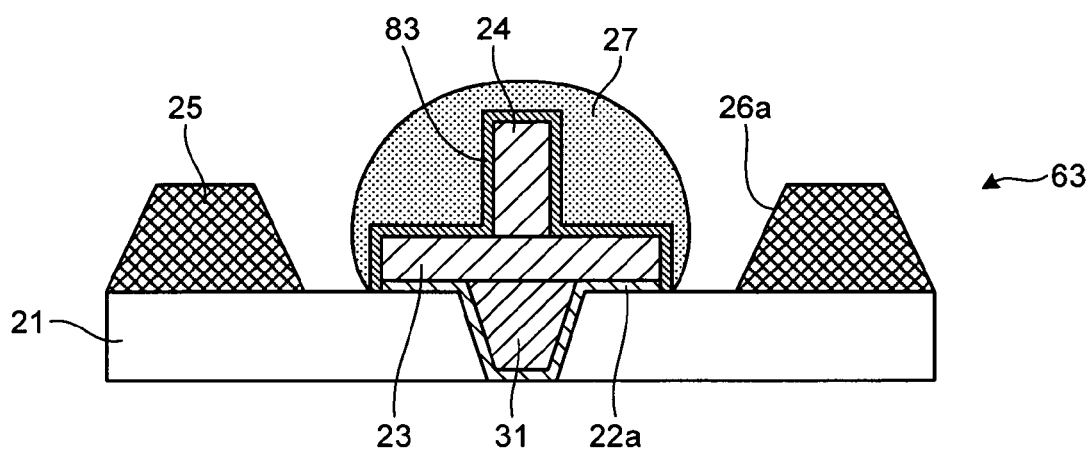
FIG. 10 is a cross-sectional view of a semiconductor chip mounting layer constituting the package substrate unit according to a fourth embodiment.

FIG. 10 is a cross-sectional view of a semiconductor chip mounting layer 63 constituting the package substrate unit according to the fourth embodiment. As compared to the configuration illustrated in FIG. 9 according to the third embodiment, the semiconductor chip mounting layer 63 illustrated in FIG. 10 according to the fourth embodiment differs in the fact that, in addition to the configuration according to the third embodiment, surface treatment with heat resistant pre-flux processing is performed on the surface of the metal posts 24 and on the surface of the conductive pads 23 so that a surface treatment layer 83 is formed. Then, the mushroom-shaped solder bumps 27 are formed on the top surface of the surface treatment layer 83, which is formed on the metal posts 24 and the conductive pads 23.

Thus, according to the fourth embodiment, in an identical manner to the third embodiment, the solder bumps 27 enable achieving enhancement in the electrical conductivity of the solder bumps 27 and the conductive pads 23 with respect to the semiconductor chip 10. Moreover, since the surface treatment layer 83 is formed on the metal posts 24 and the conductive pads 23, it becomes possible to enhance the connection strength and the electrical conductivity between the surface of the metal posts 24 as well as the surface of the conductive pads 23 and the solder bumps 27.

[e] Fifth Embodiment

Figure 11:
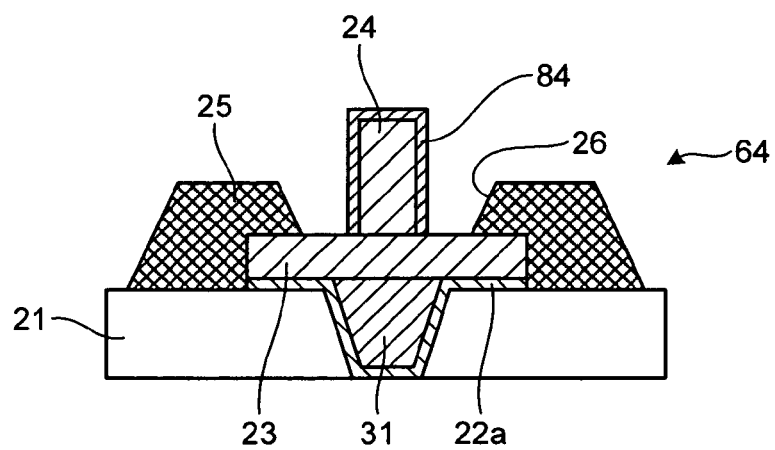
FIG. 11 is a cross-sectional view of a semiconductor chip mounting layer constituting the package substrate unit according to a fifth embodiment.

FIG. 11 is a cross-sectional view of a semiconductor chip mounting layer 64 constituting the package substrate unit according to the fifth embodiment. As illustrated in FIG. 11, in the semiconductor chip mounting layer 64 according to the fifth embodiment, the solder bumps 27 are not formed at the openings 26 on the solder resist layer 25. Instead, solders 84 are formed around the surface of the metal posts 24, which are formed on the top surface of the conductive pads 23. Thus, in the fifth embodiment, since the solders 84 are formed only around the surface of the metal posts 24, it becomes possible to reduce the solder amount required for the formation of solder joints between the solder bumps 11, which are formed at the end terminals of the semiconductor chip 10, and the metal posts 24, and this design enables the finer pitch.

[f] Sixth Embodiment

Figure 12:
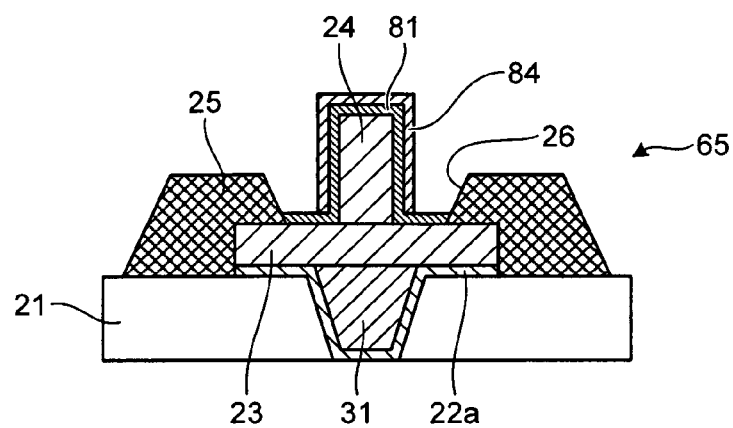
FIG. 12 is a cross-sectional view of a semiconductor chip mounting layer constituting the package substrate unit according to a sixth embodiment.

FIG. 12 is a cross-sectional view of a semiconductor chip mounting layer 65 constituting the package substrate unit according to the sixth embodiment. As illustrated in FIG. 12, in the semiconductor chip mounting layer 65 according to the sixth embodiment, surface treatment with heat resistant pre-flux processing is performed on the surface of the metal posts 24 and on a portion of the top surface of the conductive pads 23 so that the surface treatment layer 81 is formed. In addition, the solders 84 are formed on the surface of the metal posts 24. Thus, in the sixth embodiment, the solder amount can be reduced and the finer pitch is possible in an identical manner to the fifth embodiment. Besides, since the surface treatment layer 81 is formed, it becomes possible to enhance the electrical conductivity of the solder bump 27 and the conductive pads 23 with respect to the semiconductor chip 10.

[g] Seventh Embodiment

Figure 13:
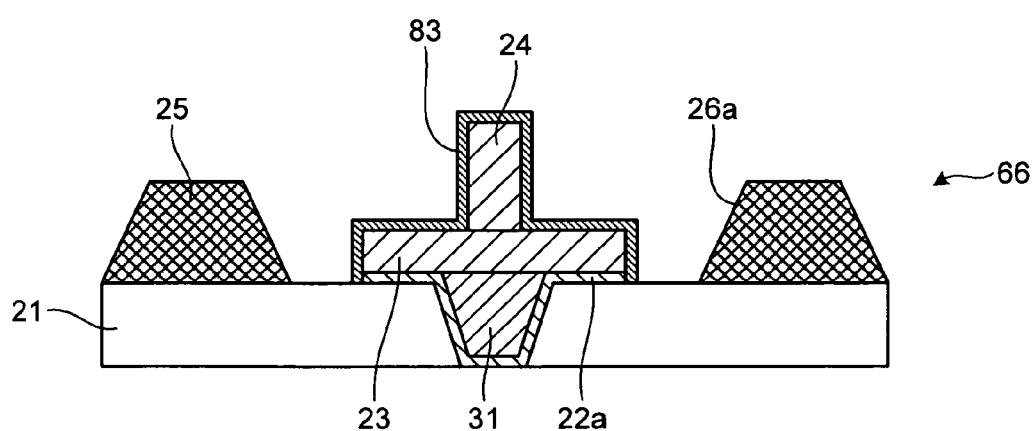
FIG. 13 is a cross-sectional view of a semiconductor chip mounting layer constituting the package substrate unit according to a seventh embodiment.

FIG. 13 is a cross-sectional view of a semiconductor chip mounting layer 66 constituting the package substrate unit according to the seventh embodiment. As illustrated in FIG. 13, in the semiconductor chip mounting layer 66 according to the seventh embodiment, the openings 26a formed on the solder resist layer 25 are formed to be wider in dimension. Besides, the solder bumps 27 are not formed at the metal posts 24. Moreover, surface treatment with heat resistant pre-flux processing is performed on the surface of the metal posts 24 and on the surface of the conductive pads 23 so that the surface treatment layer 83 is formed. Thus, in the seventh embodiment, the formation of the surface treatment layer 83 makes it possible to enhance the electrical conductivity of the solder bump 27 and the conductive pads 23 with respect to the semiconductor chip 10.

[h] Eighth Embodiment

Figure 14:
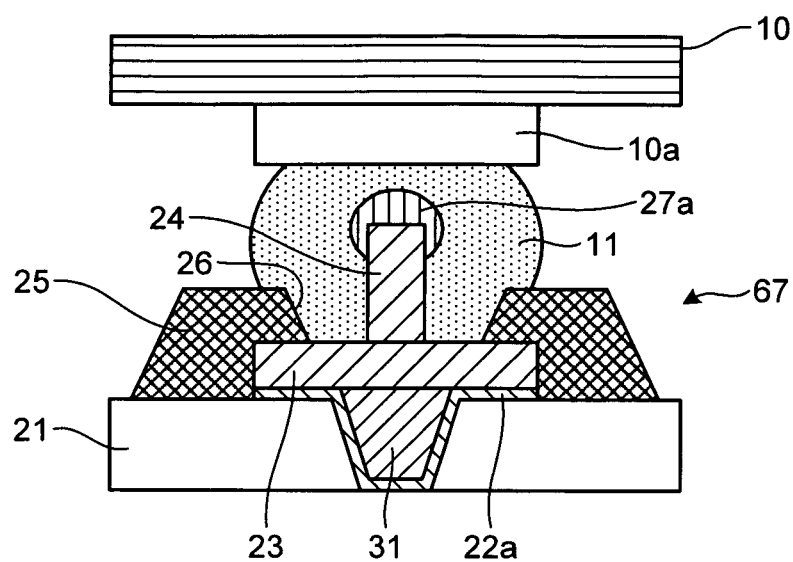
FIG. 14 is a cross-sectional view of a semiconductor chip mounting layer constituting the package substrate unit according to an eighth embodiment.

FIG. 14 is a cross-sectional view of a semiconductor chip mounting layer 67 constituting the package substrate unit according to the eighth embodiment. As illustrated in FIG. 14, in the semiconductor chip mounting layer 67 according to the eighth embodiment, solder bumps 27a are formed in a small amount on the top surface of the metal posts 24 that are formed on the top surface of the conductive pads 23. The solder bumps 27a directly form solder joints with the solder bumps 11 formed on the semiconductor chip 10.

Thus, in the eighth embodiment, since the solder bumps 27a are formed only a small amount on the top surface of the metal posts 24 and the solder bumps 27a directly form solder joints with the solder bumps 11 formed on the semiconductor chip 10, it becomes possible to enhance the electrical conductivity of the metal posts 24 and the conductive pads 23.

[i] Ninth Embodiment

Figure 15:
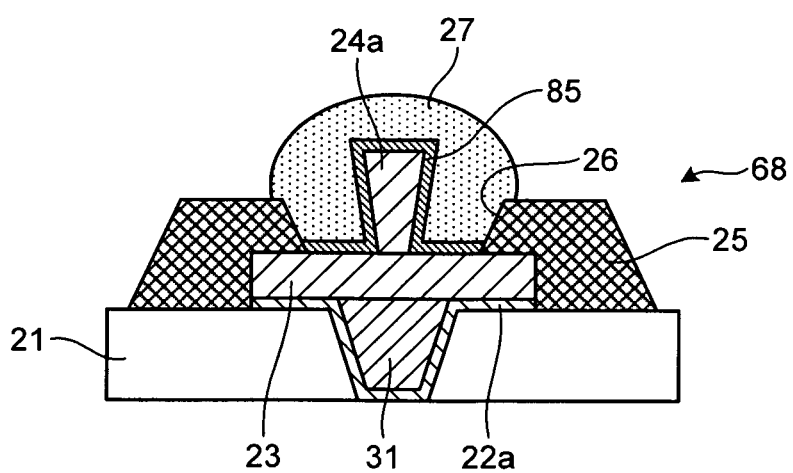
FIG. 15 is a cross-sectional view of a semiconductor chip mounting layer constituting the package substrate unit according to a ninth embodiment.

FIG. 15 is a cross-sectional view of a semiconductor chip mounting layer 68 constituting the package substrate unit according to the ninth embodiment. As illustrated in FIG. 15, in the semiconductor chip mounting layer 68 according to the ninth embodiment, metal posts 24a formed on the top surface of the conductive pads 23 are conical in shape with the upper diameter being larger than the lower diameter.

Besides, surface treatment with heat resistant pre-flux processing is performed on the surface of the metal posts 24, which are formed on the top surface of the conductive pads 23, and performed on a portion of the top surface of the conductive pads 23 so that a surface treatment layer 85 is formed. In an identical manner to the second embodiment, by forming the surface treatment layer 85 on the surface of the metal posts 24a and on a portion of the top surface of the conductive pads 23 in the ninth embodiment, it becomes possible to enhance the connection strength and the electrical conductivity between the surface of the metal posts 24a as well as the surface of the conductive pads 23 and the solder bumps 27 that are formed at the openings 26 on the solder resist layer 25.

Meanwhile, in the ninth embodiment, the solder bumps 27 are formed at the openings 26 on the solder resist layer 25 and on the surface of the metal posts 24*a*. However, alternatively, the solder bumps 27 may not be formed in an identical manner to the seventh embodiment. That is, it is also possible to make the metal posts 24*a* directly form solder joints with the solder bumps 11 formed on the semiconductor chip 10 via the surface treatment layer 85. In that case, the solder amount can be reduced and this enables the finer pitch structure.

[j] Tenth Embodiment

Figure 16:
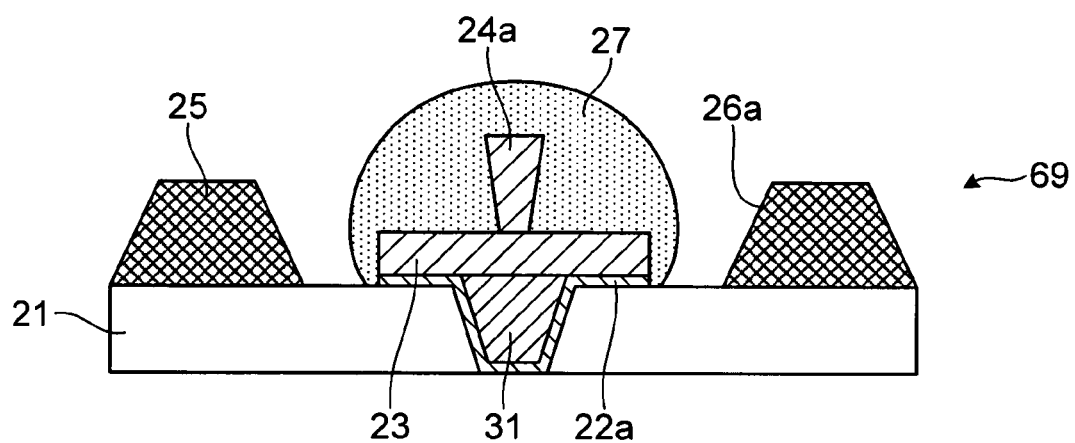
FIG. 16 is a cross-sectional view of a semiconductor chip mounting layer constituting the package substrate unit according to a tenth embodiment.

FIG. 16 is a cross-sectional view of a semiconductor chip mounting layer 69 constituting the package substrate unit according to the tenth embodiment. As illustrated in FIG. 16, in the semiconductor chip mounting layer 69 according to the tenth embodiment, the metal posts 24*a* formed on the top surface of the conductive pads 23 are conical in shape with the upper diameter being larger than the lower diameter. Moreover, the openings 26*a* formed on the solder resist layer 25 are formed to be wider in dimension. Besides, the solder bumps 27, which form solder joints with the solder bumps 11 formed on the semiconductor chip 10, are formed in the shape of mushrooms.

In this way, in the tenth embodiment, the solder bumps 27 enable achieving enhancement in the electrical conductivity of the solder bumps 27 and the conductive pads 23 with respect to the semiconductor chip 10.

[k] Eleventh Embodiment

Figure 17:
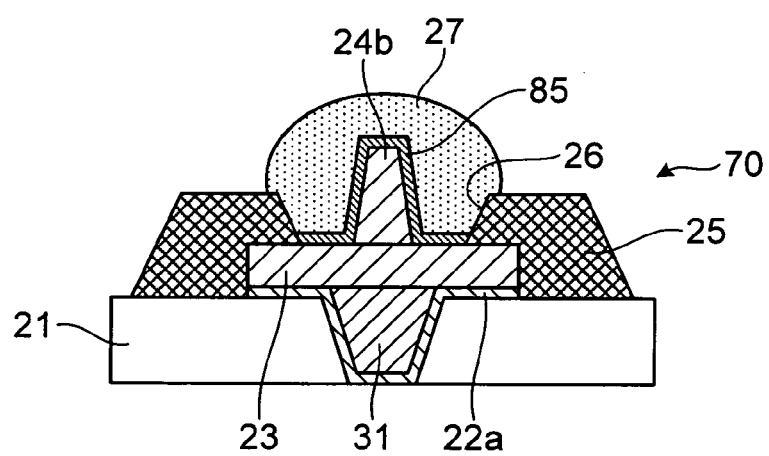
FIG. 17 is a cross-sectional view of a semiconductor chip mounting layer constituting the package substrate unit according to an eleventh embodiment.

FIG. 17 is a cross-sectional view of a semiconductor chip mounting layer 70 constituting the package substrate unit according to the eleventh embodiment. As illustrated in FIG. 17, in the semiconductor chip mounting layer 70 according to the eleventh embodiment, metal posts 24*b* formed on the top surface of the conductive pads 23 are conical in shape with the lower diameter being larger than the upper diameter. Besides, surface treatment with heat resistant pre-flux processing is performed on the surface of the metal posts 24*b*, which are formed on the top surface of the conductive pads 23, and performed on a portion of the top surface of the conductive pads 23 so that the surface treatment layer 85 is formed.

Thus, in an identical manner to the ninth embodiment, by forming the surface treatment layer 85 on the surface of the metal posts 24*b* and on a portion of the top surface of the conductive pads 23 in the eleventh embodiment, it becomes possible to enhance the connection strength with the solder bumps 27 formed at the openings 26 on the solder resist layer 25.

Alternatively, in an identical manner to the ninth embodiment, the solder bumps 27 may not be formed and the metal posts 24*a* may be made to directly form solder joints with the solder bumps 11 formed on the semiconductor chip 10 via the surface treatment layer 85. As a result, the solder amount can be reduced and the pitch can be made finer.

[l] Twelfth Embodiment

Figure 18:
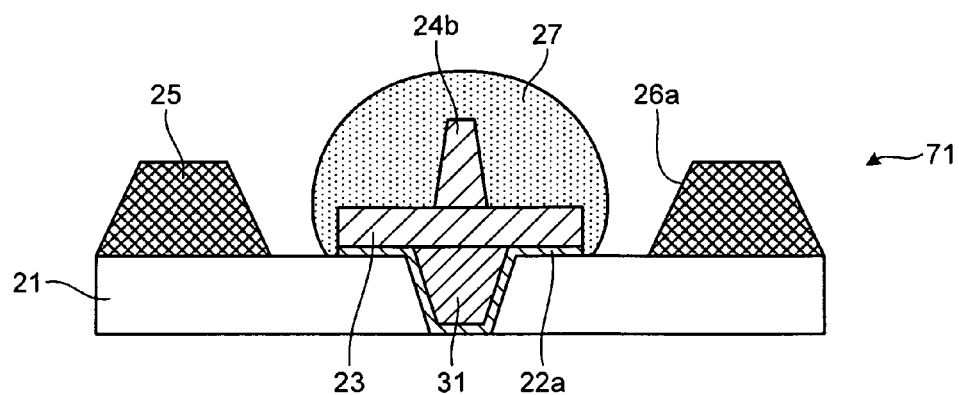
FIG. 18 is a cross-sectional view of a semiconductor chip mounting layer constituting the package substrate unit according to a twelfth embodiment.

FIG. 18 is a cross-sectional view of a semiconductor chip mounting layer 71 constituting the package substrate unit according to the twelfth embodiment. As illustrated in FIG. 18, in the semiconductor chip mounting layer 71 according to the twelfth embodiment, the metal posts 24*b* formed on the top surface of the conductive pads 23 are conical in shape with the lower diameter being larger than the upper diameter. Moreover, the openings 26*a* formed on the solder resist layer 25 are formed to be wider in dimension. Besides, the solder bumps 27, which form solder joints with the solder bumps 11 formed on the semiconductor chip 10, are formed in the shape of mushrooms.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method for manufacturing a package substrate unit, the method comprising:
   forming a core layer;
   forming a buildup layer on the core layer;
   forming in an insulation layer that is positioned on an outside of the buildup layer a hole at a position where a via is formed, and forming a conductive seed metal layer on the insulation layer and on a surface where the hole is formed;
   forming the via at the position;
   forming a conductive pad that is positioned on the via and the conductive seed metal layer;
   forming a dry film resist layer on the conductive seed metal layer and the conductive pad;
   forming in the dry film resist layer a first opening at a position of the hole, and forming a metal post by filling the first opening with copper plating;
   removing the dry film resist layer;
   forming a solder resist layer on the insulation layer;
   forming in the solder resist layer a second opening at a surface of the conductive pad and around the metal post; and
   printing a solder bump at the second opening.

2. The method according to claim 1, wherein the solder resist layer is formed so that a height of the solder resist layer is lower than a height of the metal post.

\* \* \* \* \*